United States Patent
Kwok

(10) Patent No.: US 9,137,901 B2
(45) Date of Patent: Sep. 15, 2015

(54) PULSED AIR-ACTUATED MICRO-DROPLET ON DEMAND INK JET

(71) Applicant: Illinois Tool Works Inc., Glenview, IL (US)

(72) Inventor: Kui-Chiu Kwok, Gurnee, IL (US)

(73) Assignee: Illinois Tool Works Inc., Glenview, IL (US)

(*) Notice: Subject to any disclaimer, the term of this patent is extended or adjusted under 35 U.S.C. 154(b) by 0 days.

(21) Appl. No.: 14/217,350

(22) Filed: Mar. 17, 2014

(65) Prior Publication Data

US 2014/0354733 A1 Dec. 4, 2014

Related U.S. Application Data

(62) Division of application No. 13/135,215, filed on Jun. 29, 2011, now Pat. No. 8,714,716.

(60) Provisional application No. 61/376,942, filed on Aug. 25, 2010.

(51) Int. Cl.
*B41J 2/07* (2006.01)
*H05K 3/00* (2006.01)
*B41J 2/045* (2006.01)
*B41J 2/14* (2006.01)

(52) U.S. Cl.
CPC .............. *H05K 3/0091* (2013.01); *B41J 2/045* (2013.01); *B41J 2/14* (2013.01); *B41J 2202/02* (2013.01); *H05K 2203/11* (2013.01)

(58) Field of Classification Search
CPC ...... B41J 2202/00; B41J 2202/02; B41J 2/02; B41J 2202/31; B41J 2202/33; B41J 2/04583; B41J 2/04586; B41J 2202/16555; B41J 2/04516; B41J 2/04526
See application file for complete search history.

(56) References Cited

U.S. PATENT DOCUMENTS

| | | | | |
|---|---|---|---|---|
| 4,672,397 | A * | 6/1987 | Suga et al. | 347/21 |
| 2006/0071974 | A1 * | 4/2006 | Kawase | 347/54 |

* cited by examiner

*Primary Examiner* — Geoffrey Mruk
(74) *Attorney, Agent, or Firm* — Patula & Associates, P.C.

(57) ABSTRACT

The present subject matter relates to a method and system for pulsed air-actuated micro-droplet on demand jetting, especially for jetting high viscosity liquids. A needle extends from a liquid chamber and terminates in a drop-forming orifice outlet from which micro-droplets are generated. At least two air jets direct a timed pulse of air at the drop-forming orifice outlet of the needle. The pulsed air is synchronized with the formation of a desired volume of liquid at the orifice outlet to extract and propel a micro-droplet at high velocity to a substrate. The air jets are turned on prior to the forming of the desired volume at the orifice outlet of the needle, and turned off after the micro-droplet had been produced.

20 Claims, 3 Drawing Sheets

PULSED AIR-ACTUATED MICRO-DROPLET ON DEMAND INK JET

CLAIM OF PRIORITY

This application relates to and claims priority to U.S. Provisional Patent Application entitled "Pulsed Air-Actuated Micro-Droplet on Demand Ink Jet" filed Aug. 25, 2010 and assigned U.S. Application Ser. No. 61/376,942; the entire disclosure of which is hereby herein incorporated by reference.

TECHNICAL FIELD

The exemplary teachings herein pertain to methods and systems for ink jet heads for ink jet printers or other liquid jetting devices, and in particular, to a pulsed air-actuated micro-droplet on demand ink jet head. Specifically, the present disclosure relates to an ink jet head using pulsed air to extract and propel micro-droplets from a needle-shaped orifice at high velocity, for jetting high viscosity liquids with drop-on-demand requirements.

BACKGROUND

As is known in the art, ink jet printers use one or more ink jet heads for projecting drops of ink onto a printing medium (such as paper) to generate text, graphical images or other indicia. Drops are projected from a minute external orifice in each head to the printing medium so as to form the text, graphical images or other indicia on the printing medium. A suitable control system synchronizes the generation of ink drops. It is important that the ink drops be of substantially uniform size, and also that the drops are applied consistently onto the printing medium so that printing is not distorted.

Existing ink jet technology, whether it is thermal jet or piezo-jet, can only jet micro-droplets with low viscosity liquids (typically 2-15 centistokes), such as water based inks, and only for short printing distances. In such existing ink jet technology, a pressure pulse is applied to a fluid chamber with sufficient pressure to overcome surface tension forces, thereby forming and ejecting a droplet of fluid from the ink jet nozzle. However, for jetting higher viscosity liquids (greater than 100 centistokes) with drop-on-demand requirement, there is no known ink jetting method.

In one basic type of ink jet head, ink drops are produced on demand, for example as disclosed in U.S. Pat. No. 4,106,032 issued to Miura, et al. on Aug. 8, 1978, the entire disclosure of which is herein incorporated by reference. In such drop-on-demand ink jet heads, ink in an ink chamber in the ink jet head, in response to a pressure wave generated from an electric pulse applied to a piezoelectric crystal, flows through an ink passageway in an ink chamber wall and forms an ink drop at an internal drop-forming orifice outlet located at the outer surface of the ink chamber wall. The ink drop passes from the drop-forming orifice outlet, through an air chamber, and toward a main external orifice of the ink jet head leading to the print medium. Continuous air under pressure is delivered to the air chamber and propels the ink drop through the air chamber and to the print medium.

However, such prior art drop-on-demand ink jet heads suffer from numerous disadvantages, drawbacks and/or limitations, for example as discussed in U.S. Pat. No. 4,613,875 issued to Le et al. on Sep. 23, 1986, and in U.S. Pat. No. 4,728,969 issued to Le et al. on Mar. 1, 1988, the entire disclosures of these patents are herein incorporated by reference. In an attempt to improve upon such prior art drop-on-demand ink jet heads, Le et al. discloses in the '875 patent an ink chamber with an ink drop-forming orifice outlet from which ink drops are generated in response to pressure waves caused by a piezoelectric crystal. This internal orifice outlet is centered in a projecting structure which extends toward an external orifice. The projecting structure is of a frustoconical or mesa-like shape. As stated therein, air flowing past the top (orifice outlet) of the projection prevents ink from wetting anything but the top of the projection, resulting in highly uniform ink drop formation with a single uniform dot being produced on the printing medium in response to each pressure wave.

Reproduced herein as FIG. 1, for the purpose of illustration, is the prior art FIG. 2 from the '875 patent to Le et al. showing this projecting structure of Le et al. As can be seen therein, the projection extends a length "D" into an annular air chamber, almost completely to the external orifice, with only a small spacing "E" there between. Le et al. discloses that the length of the projection is in the range of 50-90 μm with a preferred distance of 60 μm.

However, this configuration suffers from numerous disadvantages, drawbacks and/or limitations itself. For example, Le et al. uses continuous air flow to accelerate the ink drop. As such, if the velocity is too high, the continuous air flow will adversely affect the ink drop as it is propelled to the printing medium, resulting in a poor or failed printing result. If the velocity is too low, then the ink drop will not properly form and will not be propelled at a high enough velocity, again resulting in a poor or failed printing result. These limitations are particularly apparent with higher viscosity liquids.

Therefore, a need exists for an improved air assisted drop-on-demand ink jet head which is directed toward overcoming these and other disadvantages of prior art devices. Accordingly, to address the above stated issues, a method and system for jetting high viscosity liquids to form micro-droplets and at high velocity for achieving increased print distances is needed. The exemplary teachings herein fulfill such a need. It is desired that the methods and systems for providing the above benefits be applicable to any instances or applications wherein micro-droplets of high viscosity liquid are to be dispensed.

SUMMARY

The exemplary technique(s), system(s) and method(s) presented herein relate to a pulsed air-actuated micro-droplet on demand ink/liquid jet, and in particular for jetting higher viscosity liquids with drop-on-demand requirement. The exemplary method and system include utilizing a needle extending from an ink chamber, the needle terminating in an ink drop-forming orifice outlet from which ink drops are generated, and at least two air jets directing a non-continuous or pulsed air flow at the ink drop-forming orifice outlet of the needle. The pulsed air is synchronized with the generation of a desired volume of ink at the orifice outlet to extract and propel a micro-droplet at high velocity for printing.

In use, ink from an ink chamber is supplied through the needle to its ink drop-forming orifice outlet, and the desired volume is pushed by a suitable actuator to the exit of the orifice and exposed. At least two air jets on opposite side of the exposed ink at the exit of the orifice are used to extract the volume of ink to produce a micro-droplet. The air jets produce a timed pulse of high velocity air to break off the micro-droplet and propel it onto the printing medium. The air jets are turned on prior to or contemporaneously with the forming of the desired volume at the exit of the orifice outlet of the needle, and turned off after the micro-droplet had been produced. A suitable control system synchronizes both the generation of desired volume at the needle orifice and the timing of the pulse of high velocity of air from the air jets. In this manner, micro-droplets on demand can be produced for liquids in a wide range of viscosities, and for printing at greater print distances.

Additional objects, advantages and novel features will be set forth in part in the description which follows, and in part will become apparent to those skilled in the art upon examination of the following and the accompanying drawings or may be learned by production or operation of the examples.

BRIEF DESCRIPTION OF THE DRAWINGS

The drawing figures depict one or more implementations in accord with the present teachings, by way of example only, not by way of limitation. In the drawing figures, like reference numerals refer to the same or similar elements.

DETAILED DESCRIPTION

The following description refers to numerous specific details which are set forth by way of examples to provide a thorough understanding of the relevant teachings. It should be apparent to those skilled in the art that the present teachings may be practiced without such details. In other instances, well known methods, procedures, components, and circuitry have been described at a relatively high-level, without detail, in order to avoid unnecessarily obscuring aspects of the present teachings. While the description refers by way of example to ink and ink jet printing, is should be understood that the method(s) and system(s) described herein may be used for jetting any type of liquid of various viscosities, and for application to any type of substrate, for example, wood, metal, plastic, textiles, etc.

Figure 1:
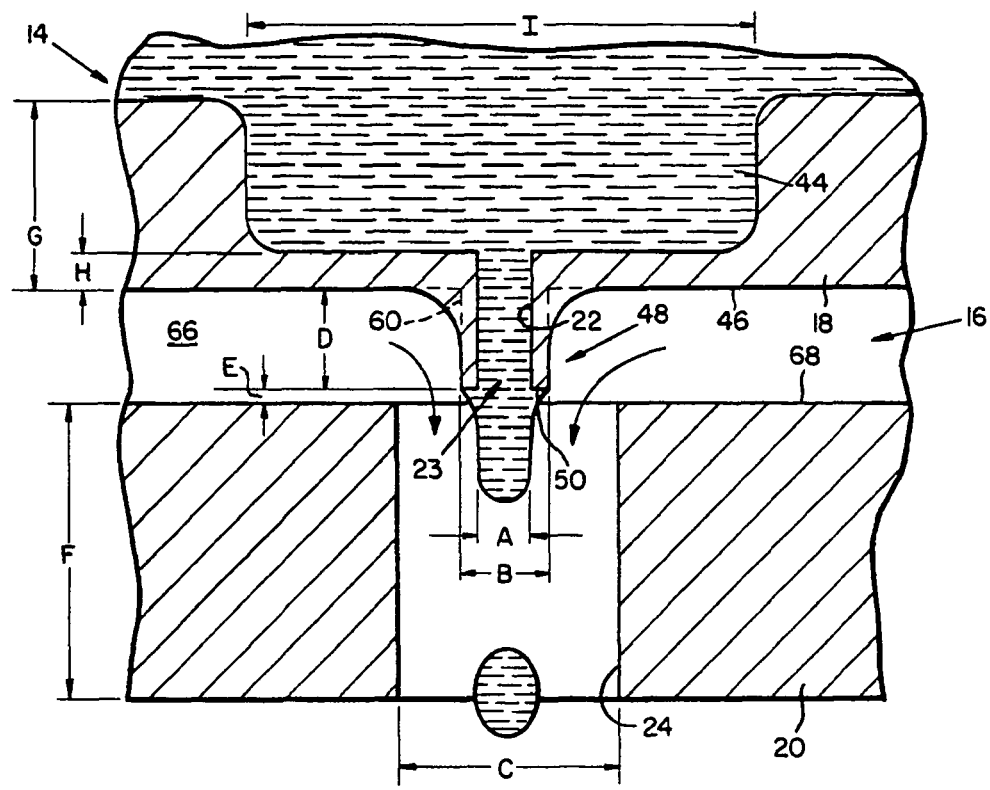
FIG. 1 is an illustration of a prior art air assisted drop-on-demand ink jet head.
Figure 2A:
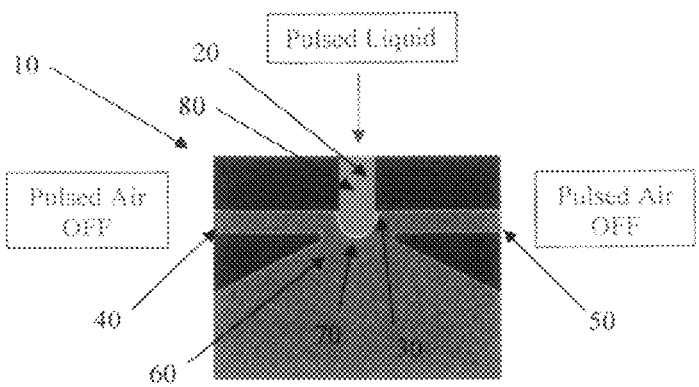
FIGS. 2A, 2B, 2C and 2D are schematic depictions of the formation of a micro-droplet by the method and system of the present disclosure.
Figure 2B:
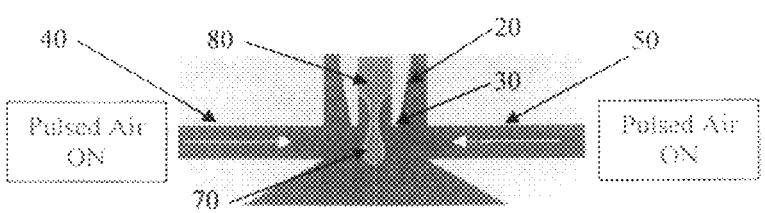
Figure 2C:
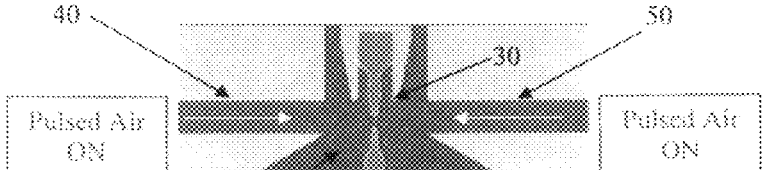
Figure 2D:
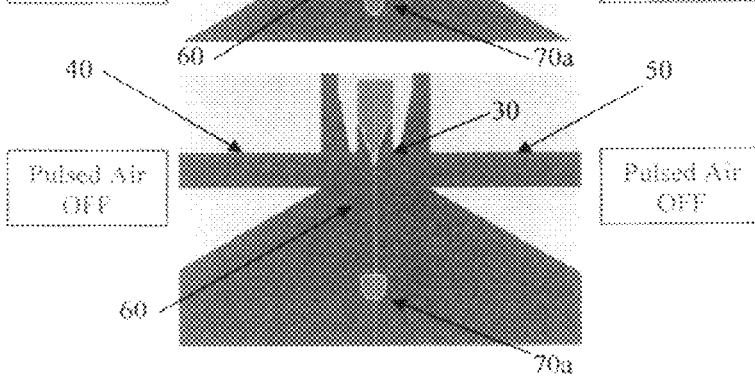

The description now proceeds with a discussion of FIGS. 2A-2D, which depict by way of example the following: FIG. 2A illustrates the initial formation of the desired volume of ink at the orifice outlet of the needle, and the beginning of the timed pulse of air from the air jets. FIG. 2B illustrates the initial formation of the micro-droplet by the pulsed air from the air jets. FIG. 2C illustrates the breaking away of the micro-droplet from the supply of ink and the orifice outlet of the needle, and the acceleration of the micro-droplet toward the printing medium. FIG. 2D illustrates the completed micro-droplet exiting the external orifice of the ink jet head, and the ending of the timed pulse of air.

Accordingly, FIGS. 2A-2D illustrate schematically a cross-sectional view of the ink drop-forming portion of an exemplary ink jet head of the system 10 of the present disclosure. As can be seen, the end of a needle 20 terminates in an orifice outlet 30. A first air jet 40 and a second air jet 50 are positioned at opposite sides of the orifice outlet 30 for directing a timed pulse of air at the orifice outlet 30. An external orifice 60 of the exemplary ink jet head is located under the orifice outlet 30 of needle 20. The external orifice 60 is axially aligned with the needle 20 and its orifice outlet 30.

Turning now to FIG. 2A, an initial formation of the desired volume 70 of ink 80 is formed at the orifice outlet 30 of the needle 20 by a suitable actuator, such as a piezoelectric crystal, a piston, or any other suitable actuator capable of pulsing the ink from an ink chamber into and through the needle 20. The actuator force need not be sufficient to fully eject a droplet from the needle outlet. The desired volume 70 is depicted as the generally semi-spherical projection of ink extending out from the orifice outlet 30 of the needle 20. Prior to or simultaneously with the formation of the desired volume 70, the first air jet 40 and the second air jet 50 are activated in concert to deliver a timed pulse of air at the desired volume 70.

As a result, the force of the pulsed air from the air jets 40 and 50 squeezes the desired volume 70, as illustrated in FIG. 2B, until the desired volume 70 breaks free from the remainder of the ink 80 in the needle 20, as illustrated in FIG. 2C, thus creating the micro-droplet 70a. As illustrated in FIG. 2C, the force from of the pulsed air from the air jets 40 and 50 continues to accelerate the micro-droplet 70a out of the external orifice 60 and towards the printing medium.

Once the micro-droplet 70a is formed and propelled out of the external orifice 60, the air jets 40 and 50 are deactivated, as illustrated in FIG. 2D. By utilizing a timed pulse of air to create and accelerate the micro-droplet 70a using the method described above, a micro-droplet smaller than the diameter of the orifice outlet 30 can be created and accelerated at a high enough velocity for proper jetting, and at longer print distances. This is true even for high viscosity liquids. Ending the timed pulse of air at the time illustrated in FIG. 2D ensures that the micro-droplet 70a will maintain its integrity as it travels to the printing medium at high velocity. A continuous high velocity air flow will shear the ink drop, produce long "tails" of ink trailing the ink drop, or otherwise adversely affect the integrity of the ink drop and result in improper or otherwise flawed application to the printing medium.

Figure 3:
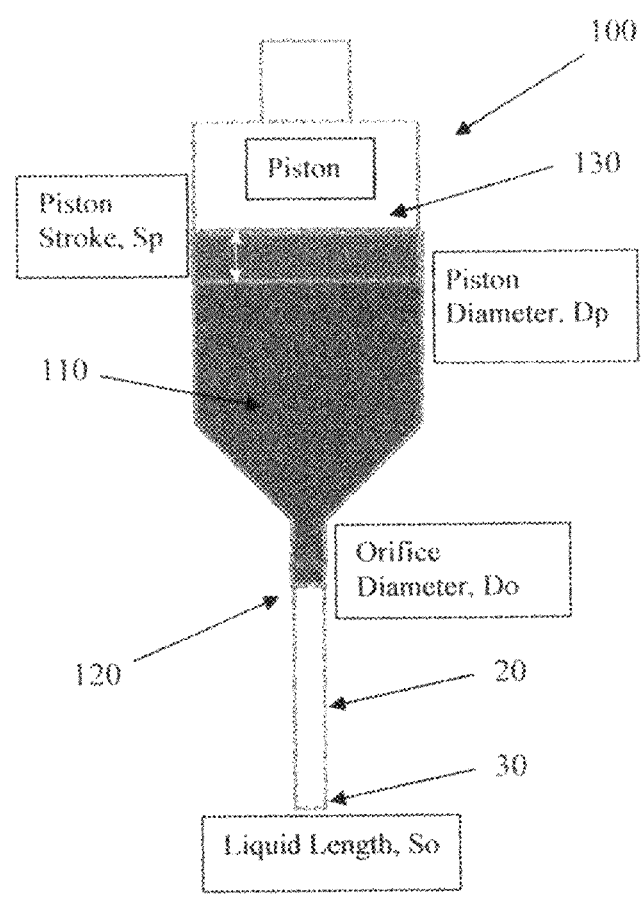
FIG. 3 is a schematic depiction of an exemplary embodiment of the needle extending from an ink chamber, and an actuator used to expose the desire volume of ink at the orifice outlet of the needle.

Referring now to FIG. 3, an exemplary embodiment of the disclosed method and system is illustrated. A piston housing 100 is illustrated having an ink chamber 110 terminating in a piston housing orifice 120 having a diameter $D_o$. A needle 20 is suitably attached to the piston housing orifice 120. The needle 20 having the same or substantially the same diameter as the piston housing orifice $D_o$. The needle 20 further defining a length or liquid length $S_o$. A piston 130 is operatively positioned inside the piston housing 100 and is moveable therein at a piston stroke distance of $S_p$. The piston 130 has a piston diameter of $D_p$. It should be understood that the piston 130 is moved via a suitable piston control system which actuates the piston 130 on demand, wherein the piston 130 travels the piston stroke distance $S_p$ to push a desired volume of ink out of the ink chamber 110, into and through the needle 20 and out of the needle orifice outlet 30, as illustrated in FIG. 2A.

While the actuator in FIG. 3 is illustrated as a piston 130, it should be understood that any suitable actuator may be used to push a desired volume of ink out of the needle 20 as shown in FIG. 2A. For example, a piezoelectric crystal may be used instead of a piston, as disclosed in the '875 patent referenced above.

Numerous factors affect the size of the ink drop, i.e. droplet diameter, and the jetting of the ink drop to the print medium. Such factors include acceleration time $\Delta_t$, orifice area $A_o$, piston area $A_p$, piston acceleration $a_p$, orifice diameter $D_o$, piston diameter $D_P$, force on piston $F_p$, piston mass $M_p$, liquid column length $S_o$, piston stroke $S_p$, average liquid velocity $U_o$, liquid final velocity at orifice $U_{o,f}$, liquid initial velocity at orifice $U_{o,i}$, average piston velocity $U_p$, piston final velocity $U_{p,f}$, piston initial velocity $U_{p,i}$, liquid density ρ, and surface tension σ. In accordance with the presently disclosed method and system, it has been determined that the size of the ink drop, or more specifically the diameter of the droplet $D_d$, can be calculated using the following equation:

$$D_d = \left(\frac{6\sigma}{\rho}\frac{M_p}{F_p}\frac{D_o^3}{D_p^2}\right)^{1/3} = \left(\frac{6\sigma}{\rho}\frac{M_p}{F_p}\frac{S_p D_o}{S_o}\right)^{1/3}$$

It can thus be seen that droplet volume is proportional to the ratio of surface tension to liquid density. Droplet volume is inversely proportional to acceleration. Droplet volume is proportional to the ratio of the cube root of the orifice diameter or $D_o^3$ to the square root of the piston diameter or $D_p^2$. It can also be seen that higher acceleration produces smaller droplet volume. To get higher acceleration, a longer stroke length is generally needed, otherwise a huge amount of energy must be supplied. However, a longer stroke generates a larger droplet volume. To get small droplet volume, a short stroke must be used, but then high acceleration cannot typically be obtained. The present method and system, however, is able to use a short stroke to produce a small droplet volume, while simultaneously achieving high droplet velocity.

In the presently disclosed method and system, only a micro-volume of ink is needed to be present at the needle orifice outlet, and the timed pulse of air from the air jets is used to extract the micro-volume. The timed pulse of air from the air jets is able to accelerate the droplet up to 340 m/s (sound velocity). Accordingly, the timed pulse of air from the air jets supplies the energy needed to extract the micro-droplets from high viscosity liquids and accelerate them to high velocities. The timed pulse of air also keeps the orifice clean, keeps the drop straight as it travels to the print medium, and adds extra detachment force.

By way of example, the embodiment illustrated in FIG. 3 was used to jet micro-droplets of 30W Motor Oil. In this example, the orifice diameter $D_o$ was 152 μm and the piston diameter $D_p$ was 850 μm. Using a piston stroke $S_p$ of 100 μm, the timed pulse of air from the air jets produced and accelerated at high velocity micro-droplets having a diameter $D_d$ less than the orifice diameter $D_o$. While the above stated dimensions are illustrative of the operation of the exemplary method and system, it should be understood that various modifications may be made to these dimensions with departing from the teachings herein.

While the foregoing discussion presents the teachings in an exemplary fashion with respect to the disclosed method and system for pulsed air-actuated, high velocity micro-droplets on demand for high viscosity liquids, it will be apparent to those skilled in the art that the teachings may apply to any type of device that produces and applies droplets of liquid to a substrate (e.g., painting, soldering, printing, etc.). Further, while the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein.

What is claimed is:

1. A system for jetting liquid, comprising:
    a liquid chamber for holding a supply of liquid;
    an actuator for pushing a volume of liquid out of the liquid chamber;
    a needle extending from the liquid chamber and terminating in a needle orifice outlet; and
    at least two air jets situated on opposite sides of the needle orifice outlet;
    wherein a desired volume of liquid is formed at and extending out from the needle orifice outlet in response to the actuator, and wherein the at least two air jets produce a timed pulse of air directed at the desired volume of liquid extending out from the needle orifice outlet to create a micro-droplet from the desired volume and to accelerate the micro-droplet to high velocity.

2. The system of claim 1, further comprising a control system for synchronizing the timed pulse of air from the at least two air jets with the formation of the desired volume of liquid at the needle orifice outlet by the actuator.

3. The system of claim 2, wherein the control system turns on the at least two air jets prior to the formation of the desired volume of liquid at the needle orifice outlet.

4. The system of claim 3, wherein the control system turns off the at least two air jets after the creation of the micro-droplet.

5. The system of claim 1, wherein the liquid is high viscosity liquid.

6. The system of claim 5, wherein the micro-droplet is equal to or smaller than a diameter of the needle orifice outlet.

7. The system of claim 1, wherein the at least two air jets are external from the needle orifice outlet.

8. The system of claim 1, wherein the desired volume of liquid extending out from the needle orifice outlet is a semi-spherical projection.

9. The system of claim 1, wherein the timed pulse of air is directed at the desired volume of liquid extending out from the needle orifice outlet perpendicularly to the needle.

10. An ink-jet system for jetting high viscosity liquid with on demand requirements, comprising:
    a liquid chamber for holding a supply of liquid;
    a needle extending from the liquid chamber and terminating in a needle orifice outlet;
    an actuator for pushing a volume of liquid out of the liquid chamber, wherein a desired volume of liquid is formed at and extending out from the needle orifice outlet in response to the actuator;
    at least two air jets diametrically situated about the needle orifice outlet, wherein the at least two air jets produce a timed pulse of air directed at the desired volume of liquid extending out from the needle orifice outlet to create a micro-droplet from the desired volume and to accelerate the micro-droplet to high velocity;
    a control system for synchronizing the timed pulse of air from the at least two air jets with the formation of the desired volume of liquid at the needle orifice outlet by the actuator; and
    an external orifice through which the micro-droplet is jetted to a printing medium.

11. The system of claim 10, wherein the micro-droplet is equal to or smaller than diameter of the needle orifice outlet.

12. The system of claim 10, wherein the control system turns on the at least two air jets prior to the formation of the desired volume of liquid at the needle orifice outlet.

13. The system of claim 12, wherein the control system turns off the at least two air jets after the creation of the micro-droplet.

14. The system of claim 10, wherein the at least two air jets are external from the needle orifice outlet.

15. The system of claim 10, wherein the desired volume of liquid extending out from the needle orifice outlet is a semi-spherical projection.

16. The system of claim 10, wherein the timed pulse of air is directed at the desired volume of liquid extending out from the needle orifice outlet perpendicularly to the needle.

17. A system of jetting liquid from an ink drop-forming device of an ink jet head, comprising:
- a needle in the ink drop-forming device, the needle having an orifice outlet;
- an actuator in the ink drop-forming device, the actuator selectively forming a desired volume of liquid at and extending out from the needle orifice outlet;
- at least two air jets external from the needle orifice outlet, the at least two air jets selectively producing a timed pulse of air directed at the desired volume of liquid extending out from the needle orifice outlet to create a micro-droplet from the desired volume and to accelerate the micro-droplet to high velocity.

18. The system of claim 17, wherein the micro-droplet is smaller than a diameter of the needle orifice outlet.

19. The system of claim 17, further comprising a control system for synchronizing the timed pulse of air from the at least two air jets with the formation of the desired volume of liquid at the needle orifice outlet by the actuator, wherein the control system begins the timed pulse of air prior to or simultaneously with the formation of the desired volume of liquid extending out from the needle orifice outlet, and ends the timed pulse of air after the micro-droplet is created and propelled out of an external orifice of the ink jet head.

20. The system of claim 17, wherein the timed pulse of air is directed at the desired volume of liquid extending out from the needle orifice outlet perpendicularly to a direction of the micro-droplet.

\* \* \* \* \*